(12) United States Patent
Lee et al.

(10) Patent No.: US 11,177,249 B2
(45) Date of Patent: Nov. 16, 2021

(54) SEMICONDUCTOR MEMORY DEVICE AND METHOD OF MANUFACTURING THE SAME

(71) Applicant: SK hynix Inc., Icheon-si (KR)

(72) Inventors: Kun Young Lee, Seoul (KR); Tae Kyung Kim, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 157 days.

(21) Appl. No.: 16/601,283

(22) Filed: Oct. 14, 2019

(65) Prior Publication Data

US 2020/0243499 A1 Jul. 30, 2020

(30) Foreign Application Priority Data

Jan. 30, 2019 (KR) .................. 10-2019-0012123

(51) Int. Cl.
| | |
|---|---|
| *H01L 29/792* | (2006.01) |
| *H01L 25/18* | (2006.01) |
| *H01L 23/00* | (2006.01) |
| *H01L 27/11582* | (2017.01) |
| *H01L 23/528* | (2006.01) |
| *H01L 25/00* | (2006.01) |
| *H01L 27/11573* | (2017.01) |

(52) U.S. Cl.
CPC ............ *H01L 25/18* (2013.01); *H01L 23/528* (2013.01); *H01L 24/05* (2013.01); *H01L 24/13* (2013.01); *H01L 24/16* (2013.01); *H01L 24/81* (2013.01); *H01L 25/50* (2013.01); *H01L 27/11573* (2013.01); *H01L 27/11582* (2013.01); *H01L 2224/16112* (2013.01); *H01L 2224/16147* (2013.01); *H01L 2224/16501* (2013.01); *H01L 2224/81026* (2013.01); *H01L 2224/8159* (2013.01); *H01L 2224/8185* (2013.01); *H01L 2224/81191* (2013.01); *H01L 2224/81539* (2013.01); *H01L 2224/81587* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,611,140 A | * | 3/1997 | Kulesza | ................. H05K 3/321 |
| | | | | 29/832 |
| 2017/0342301 A1 | * | 11/2017 | Huang | ................. C08G 59/504 |
| 2019/0081069 A1 | * | 3/2019 | Lu | ..................... H01L 27/11573 |

FOREIGN PATENT DOCUMENTS

| | | |
|---|---|---|
| CN | 107658315 A | 2/2018 |
| KR | 100962022 B1 | 6/2010 |
| KR | 101899949 B1 | 9/2018 |

\* cited by examiner

*Primary Examiner* — Niki H Nguyen
(74) *Attorney, Agent, or Firm* — William Park & Associates Ltd.

(57) ABSTRACT

The semiconductor memory device includes: a first substrate including a peripheral circuit, first conductive contact patterns connected to the peripheral circuit, and a first upper insulating layer having grooves exposing the first conductive contact patterns; a second substrate including a memory cell array, a second upper insulating layer disposed on the memory cell array, the second upper insulating layer formed between the memory cell array and the first upper insulating layer, second conductive contact patterns protruding through the second upper insulating layer into an opening of the grooves; and conductive adhesive patterns filling the grooves to connect the second conductive contact patterns to the first conductive contact patterns.

21 Claims, 14 Drawing Sheets

SEMICONDUCTOR MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2019-0012123 filed on Jan. 30, 2019, in the Korean Intellectual Property Office, the entire disclosure of which is incorporated herein by reference.

BACKGROUND

1. Technical Field

The present disclosure generally relates to a semiconductor memory device and a method of manufacturing the same, and more particularly, to a three-dimensional semiconductor memory device and a method of manufacturing the same.

2. Related Art

A semiconductor memory device may include a memory cell array including a plurality of memory cells. The memory cell array may include memory cells arranged in various structures. In order to improve the degree of integration of the memory cells, a three-dimensional semiconductor memory device has been proposed.

The three-dimensional semiconductor memory device includes three-dimensionally arranged memory cells. A technique capable of improving the stability of a manufacturing process is required when the three-dimensional semiconductor memory device is manufactured.

SUMMARY

In accordance with an aspect of the present disclosure, there is provided a semiconductor memory device including: a first substrate including a peripheral circuit, first conductive contact patterns connected to the peripheral circuit, and a first upper insulating layer having grooves exposing the first conductive contact patterns; a second substrate including a memory cell array, a second upper insulating layer disposed on the memory cell array, the second upper insulating layer formed between the memory cell array and the first upper insulating layer, second conductive contact patterns protruding through the second upper insulating layer into an opening of the grooves; and conductive adhesive patterns filling the grooves to connect the second conductive contact patterns to the first conductive contact patterns.

In accordance with an aspect of the present disclosure, there is provided a method of manufacturing a semiconductor memory device, the method including: forming a first structure on a first substrate, wherein the first structure includes a peripheral circuit, first conductive contact patterns connected to the peripheral circuit, and a first upper insulating layer with grooves exposing the first conductive contact patterns; forming a second structure on a second substrate, wherein the second structure includes a memory cell array, a second upper insulating layer disposed on the memory cell array, a second upper insulating layer formed between the memory cell array and the first upper insulating layer, and second conductive contact patterns protruding through the second upper insulating layer into an opening of the grooves; filling each of the grooves with a conductive adhesive material; and disposing the second structure on the first structure so that the second upper insulating layer is formed on the first upper insulating layer, and protrusion parts of the second conductive contact patterns are aligned in the grooves so that the conductive adhesive material is in contact with the first conductive contact patterns and the second conductive contact patterns.

BRIEF DESCRIPTION OF THE DRAWINGS

Example embodiments are described more fully hereinafter with reference to the accompanying drawings; however, they may be embodied in different forms and should not be construed as limited to the embodiments set forth herein. Rather, these embodiments are provided so that this disclosure will be enabling and convey the scope of the example embodiments to those skilled in the art.

In the drawing figures, dimensions may be exaggerated for clarity of illustration. Like reference numerals refer to like elements throughout.

DETAILED DESCRIPTION

Figure 1A:
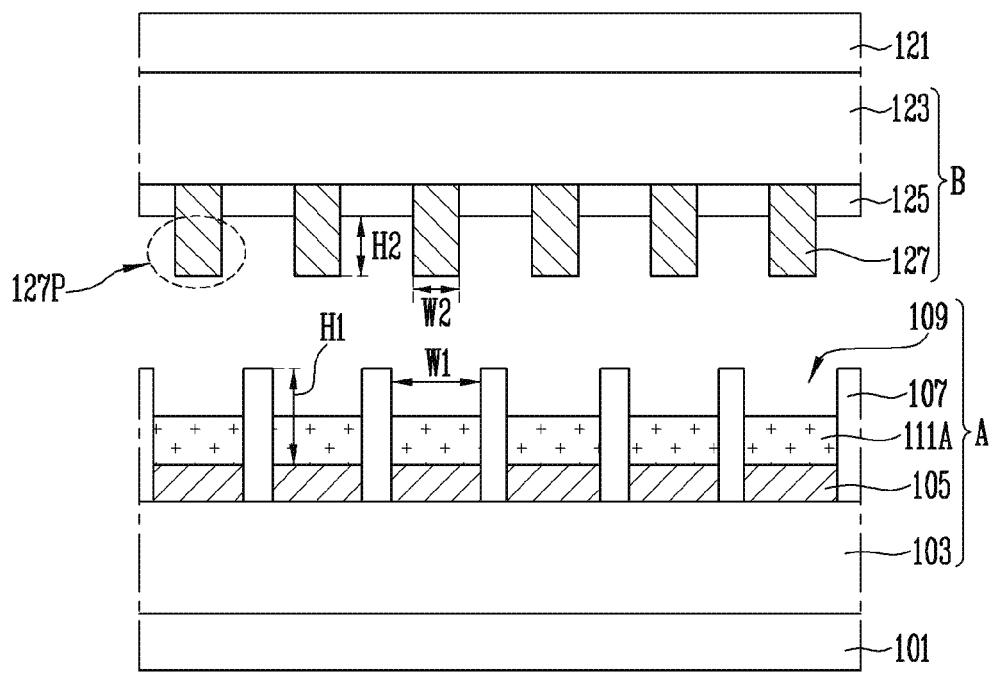
FIGS. 1A and 1B are sectional views illustrating a method of manufacturing a semiconductor memory device in accordance with an embodiment of the present disclosure.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be modified in various ways and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present.

It will be understood that when an element is referred to as being "between" two elements, it can be the only element between the two elements, or one or more intervening elements may also be present.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Embodiments provide a semiconductor memory device capable of improving the stability of a manufacturing process thereof and a method of manufacturing the semiconductor memory device.

Figure 1B:
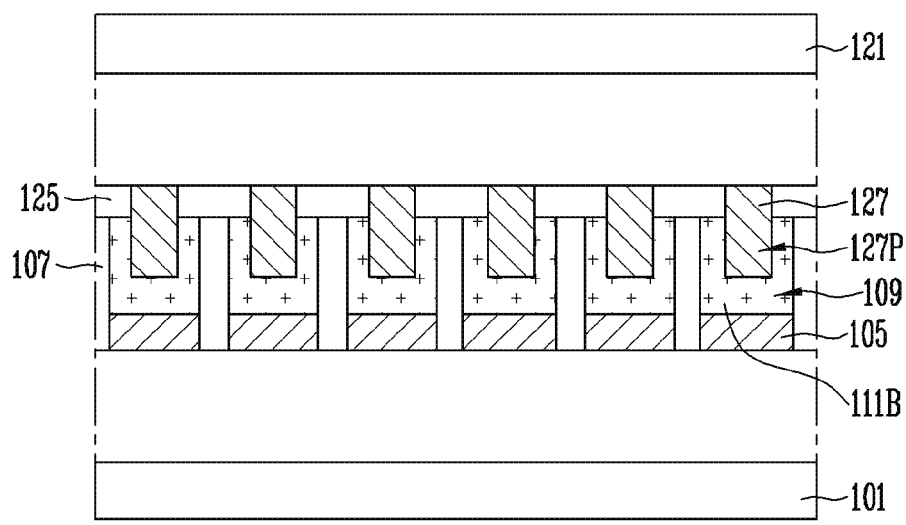

FIGS. 1A and 1B are sectional views illustrating a method of manufacturing a semiconductor memory device in accordance with an embodiment of the present disclosure.

Referring to FIG. 1A, the method of manufacturing the semiconductor memory device may include a process of forming a first structure A on a first substrate 101, a process of forming a second structure B on a second substrate 121, a process of forming a conductive adhesive material 111A in each of grooves 109 defined by the first structure A, and a process of disposing the second structure B on the first structure A.

The process of forming the first structure A on the substrate 101 may include a process of forming a first lower structure 103 on the first substrate 101, a process of forming first conductive contact patterns 105 on the first lower structure 103, and a process of forming a first upper insulating layer 107 including the grooves 109 overlapping with the first conductive contact patterns 105, the first upper insulating layer 107 covering the first lower structure 103.

The first substrate 101 may be a single crystalline semiconductor layer. For example, the first substrate 101 may be a bulk silicon substrate, a silicon-on-insulator substrate, a germanium substrate, a germanium-on-insulator substrate, a silicon-germanium substrate, or an epitaxial thin film formed through a selective epitaxial growth process.

The first lower structure 103 may include a memory cell array or include transistors constituting a peripheral circuit. An example of the memory cell array and an example of the transistors constituting the peripheral circuit will be described with reference to FIG. 5.

The first conductive contact patterns 105 may be electrically connected to the first lower structure 103. In an embodiment, when the first lower structure 103 includes a memory cell array, the first conductive contact patterns 105 may be connected to the memory cell array. In another embodiment, when the first lower structure 103 includes transistors constituting a peripheral circuit, the first conductive contact patterns 105 may be connected to the transistors. The first conductive contact patterns 105 may be formed of various conductive materials. For example, the first conductive contact patterns 105 may be formed of copper, aluminum, etc.

The first upper insulating layer 107 may be formed of an oxide layer. The grooves 109, formed in the first upper insulating layer 107, expose upper surfaces of the first conductive contact patterns 105. The upper surface of each of the first conductive contact patterns 105 may be disposed to face second conductive contact patterns 127 in a subsequent process. The cross-sectional shape of each of the grooves 109 may include various shapes such as a circular shape, an elliptical shape, a rectangular shape, square shape, etc.

The process of forming the second structure B on the second substrate 121 may include a process of forming a second lower structure 123 on the second substrate 121 and a process of forming a second upper insulating layer 125 on the second lower structure 123. The second upper insulating layer 125 covers the second lower structure 123, and the second upper insulating layer 125 is penetrated by the second conductive contact patterns 127 and.

The second substrate 121 may be a single crystalline semiconductor layer. For example, the second substrate 121 may be a bulk silicon substrate, a silicon-on-insulator substrate, a germanium substrate, a germanium-on-insulator substrate, a silicon-germanium substrate, or an epitaxial thin film formed through a selective epitaxial growth process.

The second lower structure 123 may include a memory cell array or include transistors constituting a peripheral circuit. In an embodiment, when the first lower structure 103 includes a memory cell array, the second lower structure 123 may include transistors constituting a peripheral circuit. In another embodiment, when the first lower structure 103 includes transistors constituting a peripheral circuit, the second lower structure 123 may include a memory cell array.

The second conductive contact patterns 127 may be electrically connected to the second lower structure 123. In an embodiment, when the second lower structure 123 includes a memory cell array, the second conductive contact patterns 127 may be connected to the memory cell array. In another embodiment, when the second lower structure 123 includes transistors constituting a peripheral circuit, the second conductive contact patterns 127 may be connected to the transistors. The second conductive contact patterns 127 may include protrusion parts 127P, protruding from the second upper insulating layer 125. The second conductive contact patterns 127 may be formed of various conductive materials. For example, the second conductive contact patterns 127 may be formed of tungsten, aluminum, etc. A surface of each of the second conductive contact patterns 127 may be covered with a barrier metal layer (not shown). For example, the barrier metal layer may include a titanium nitride layer.

The second upper insulating layer 125 may include an oxide layer.

A first height H1 of the first upper insulating layer 107 may protrude farther from the first conductive contact patterns 105 than a second height H2 of the protrusion parts 127P of the second conductive contact patterns 127, which protrudes from the second upper insulating layer 125 (H1>H2). In a subsequent process, direct contact between the first conductive contact patterns 105 and the second conductive contact patterns 127 may be prevented. As a result, stress applied to the protrusion parts 127P of the second conductive contact patterns 127, in a subsequent process, may be reduced.

A first width W1 of each of the grooves 109 is formed to have a greater width than a second width W2 of a corresponding second conductive contact pattern 127 (W1>W2). Accordingly, the second conductive contact patterns 127 can be easily aligned in the grooves 109 in a subsequent process.

As described above, the process of forming the first structure A on the first substrate 101 and the process of forming the second structure B on the second substrate 121 are individually performed, so that the second structure B may be protected from high temperature generated while the first structure A is being formed or the first structure A may be protected from high temperature generated while the second structure B is being formed. For example, characteristics of a peripheral circuit may be prevented from being degraded due to high temperature generated while a memory cell array is being formed.

The conductive adhesive material 111A is coated on the top of each of the first conductive contact patterns 105 in each of the grooves 109. The conductive adhesive material 111A may be a fluid material, the viscosity of which may be controlled through a solvent such as acetone or alcohol. For example, the conductive adhesive material 111A may include epoxy resin or include a compound having silver nano particles, boron nitride, and epoxy. The height of the conductive adhesive material 111A may be controlled so that the conductive adhesive material 111A does not overflow and spill out of the grooves 109 in a subsequent process. For example, the height of the conductive adhesive material 111A is controlled to be lower than the first height H1.

When the second structure B is disposed on the first structure A, the second substrate 121 is disposed on the first substrate 101 such that the second upper insulating layer 125 is opposite to the first upper insulating layer 107, and the protrusion parts 127P of the second conductive contact patterns 127 are aligned in the respective grooves 109.

Referring to FIG. 1B, the first upper insulating layer 107 and the second upper insulating layer 125 are adhered closely to each other such that the protrusion parts 127P of the second conductive contact pattern 127 are respectively aligned in the grooves 109. Subsequently, the conductive adhesive material 111A, shown in FIG. 1A, is cured so that conductive adhesive patterns 111B are formed. The conductive adhesive patterns 111B electrically connect the first conductive contact patterns 105 to the second conductive contact patterns 127, respectively.

The conductive adhesive patterns 111B are respectively disposed in the grooves 109. A curing process for forming the conductive adhesive patterns 111B may include a thermal process. For example, the conductive adhesive patterns 111B may be formed through a thermal process performed at a temperature of 100° C. to 150° C. for two hours or more. The curing process, in accordance with the embodiment of the present disclosure, is not limited thereto, and the temperature of the thermal process and the maintenance time of the thermal process may be changed depending on the composition of the conductive adhesive material.

As described with reference to FIG. 1A, when the first height H1 of the first upper insulating layer 107 is formed to have a greater height than the second height H2 of each of the protrusion parts 127P of the second conductive contact patterns 127 (H1>H2), the second conductive contact patterns 127 may not be in direct contact with the first conductive contact patterns 105. Thus, stress applied to the second conductive contact patterns 127, while the first upper insulating layer 107 and the second upper insulating layer 125 are being adhered closely to each other, may be reduced.

In accordance with the embodiment of the present disclosure, the conductive adhesive material 111A disposed in the grooves 109 has fluidity as described with reference to FIG. 1A. Accordingly, the conductive adhesive material 111A may be cured in a state in which the conductive adhesive material 111A fills a space between the first conductive contact patterns 105 and the second conductive contact patterns 127. Thus, the first conductive contact patterns 105 can be electrically connected to the second conductive contact patterns 127 via the conductive adhesive patterns 111B.

As described with reference to FIG. 1A, when the first width W1 of each of the grooves 109 is formed to have a wider width than the second width W2 of the second conductive contact pattern 127 corresponding thereto (W1>W2), an overlay margin can be increased in the process of aligning the second conductive contact patterns 127 in the respective grooves 109. Accordingly, it is unnecessary to widen the second width W2 of each of the second conductive contact patterns 127 as it would merely increase the alignment margin, and thus, the degree of integration of the semiconductor memory device can be improved.

Figure 2A:
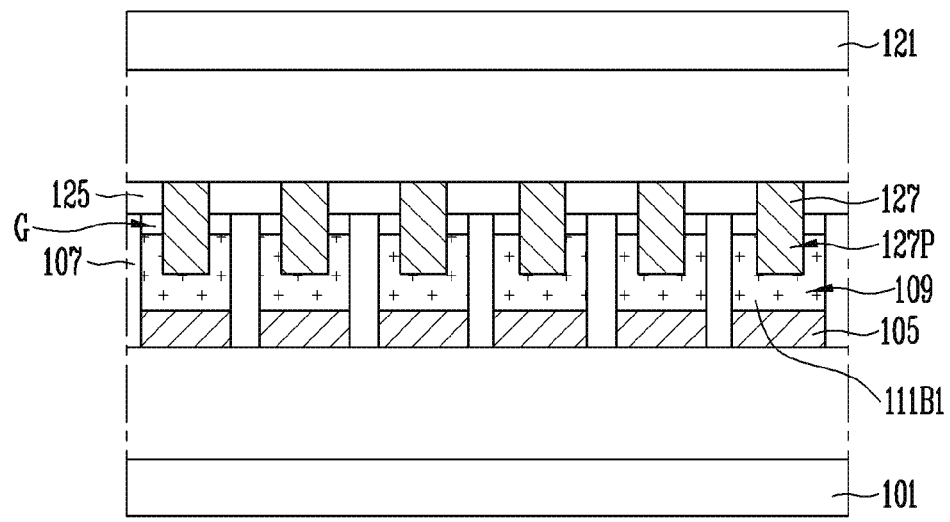
FIGS. 2A to 2C are sectional views illustrating modifications of the present disclosure.
Figure 2B:
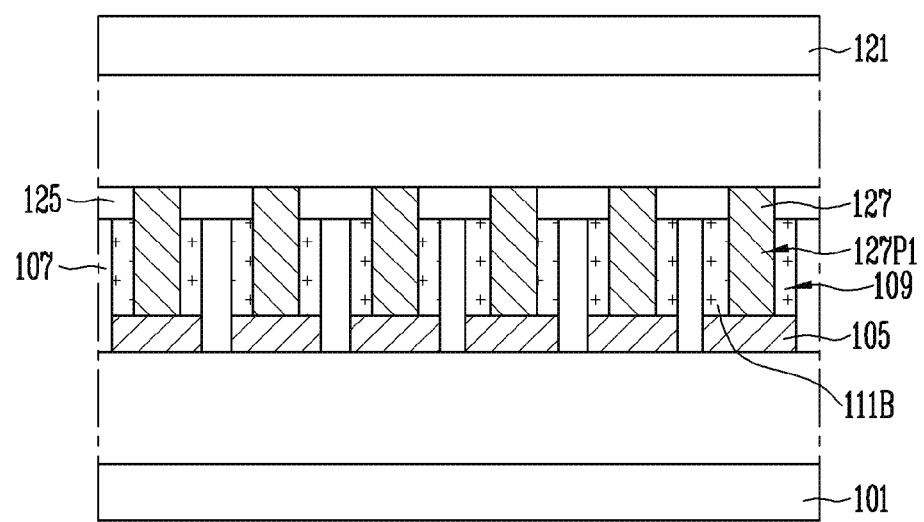
Figure 2C:
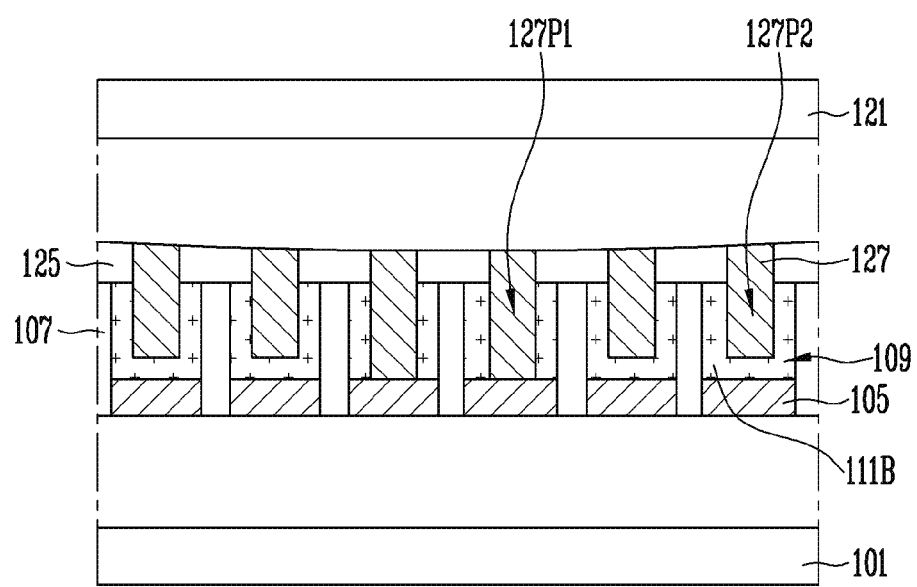

FIGS. 2A to 2C are sectional views illustrating modifications of the present disclosure.

Referring to FIG. 2A, each of conductive adhesive patterns 111B1 formed in the grooves 109 may be formed to have a height lower than that of each of the grooves 109. Accordingly, a gap G can be formed between the second upper insulating layer 125 and each of the conductive adhesive patterns 111B1 when the first substrate 101 and the second substrate 121 are adhered closely to each other. The conductive adhesive patterns 111B1 are formed to fill spaces between the first conductive contact patterns 105 and the protrusion parts 127P of the second conductive contact patterns 127. Thus, although the gap G is formed, the first conductive contact patterns 105 can still be electrically connected to the second conductive contact patterns 127 via the conductive adhesive patterns 111B1 since the conductive adhesive patterns 111B1 may be in contact with both the first conductive contact patterns 105 and the protrusion parts 127P of the second conductive contact patterns 127.

Referring to FIG. 2B, protrusion parts 127P1 of the second conductive contact patterns 127 may be formed to have a height equal to the first height of the first upper insulating layer 107, the height of the portion protruding from the first conductive contact patterns 105. Accordingly, the second conductive contact patterns 127 can be in direct contact with the first conductive contact patterns 105 when the first substrate 101 and the second substrate 121 are adhered closely to each other. The grooves 109, defined by the first upper insulating layer 107, may be filled with the conductive adhesive patterns 111B.

Referring to FIG. 2C, the second substrate 121, supporting the second conductive contact patterns 127, may be bent during a process. Therefore, protrusion parts 127P1 and 127P2 of the second conductive contact patterns 127, which protrude from the second upper insulating layer 125 toward the first conductive contact patterns 105, may not be uniformly formed. For example, upper surfaces of the protrusion parts 127P1 and 127P2, facing the first conductive contact patterns 105, may not be arranged on the same line.

In accordance with the embodiment of the present disclosure, since the conductive adhesive material 111A has fluidity as previously stated, the second conductive contact patterns 127 may be surrounded by the conductive adhesive patterns 111B even when the upper surfaces of the protrusion parts 127P1 and 127P2 are not arranged on the same line. In other words, the conductive adhesive patterns 111B may be in contact with both the first conductive contact patterns 105 and the protrusion parts 127P1 and 127P2 of the second conductive contact patterns 127 regardless of the uneven arrangement. Accordingly, in the embodiment of the present disclosure, although the second substrate 121 may bend, the first conductive contact patterns 105 and the second conductive contact patterns 127 may be stably connected through the conductive adhesive patterns 111B.

In other words, when the second substrate 121 is bent during a process, some 127P1 of the protrusion parts 127P1 and 127P2 may be formed to have a height equal to the first height of the first upper insulating layer 107, the height of the portion protruding from the first conductive contact patterns 105, and the others 127P2 of the protrusion parts 127P1 and 127P2 may be formed to have a height lower than the first height. In addition, some 127P1 of the protrusion parts 127P1 and 127P2 may be in direct contact with the first conductive contact patterns 105, and the others 127P2 of the protrusion parts 127P1 and 127P2 may be electrically connected to the first conductive contact patterns 105 via the conductive adhesive patterns 111B.

The conductive adhesive patterns 111B may have a height controlled to be in contact with the second upper insulating layer 125, as shown in FIGS. 2B and 2C. On the other hand, conductive adhesive patterns 111B may be spaced apart from the second upper insulating layer 125 with the gap G interposed therebetween as described with reference to FIG. 2A.

Figure 3A:
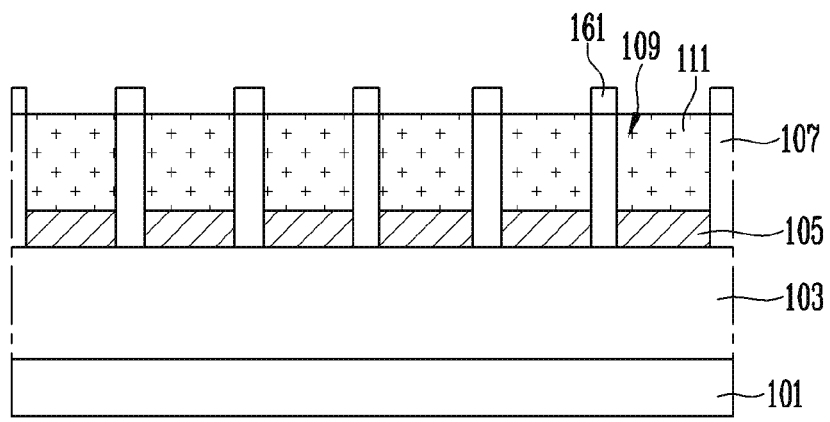
FIGS. 3A to 3C are sectional views illustrating an embodiment of a process of forming a conductive adhesive material in grooves of a first upper insulating layer shown in FIG. 1A.
Figure 3B:
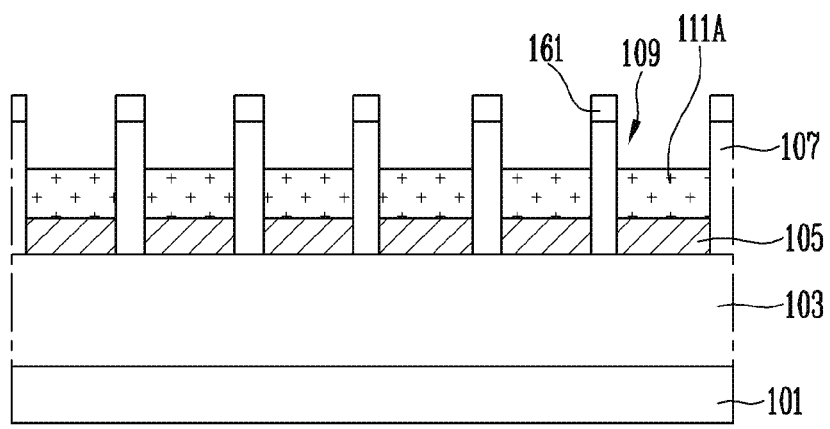
Figure 3C:
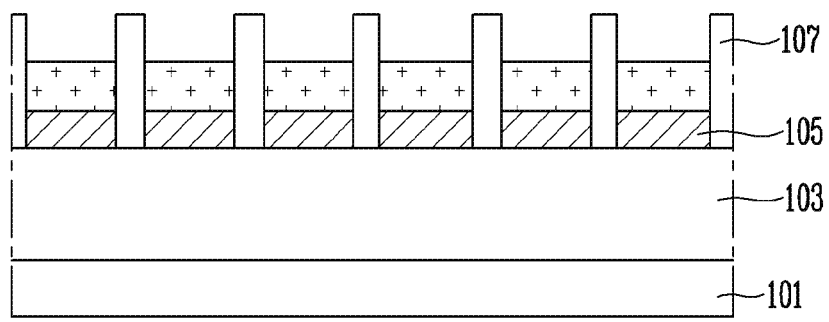

FIGS. 3A to 3C are sectional views illustrating an embodiment of the process of forming the conductive adhesive material 111A in the grooves 109 of the first upper insulating layer 107 shown in FIG. 1A.

Referring to FIG. 3A, after the first lower structure 103 and the first conductive contact patterns 105 are formed on the first substrate 101, the first upper insulating layer 107 may be formed. Before the grooves 109 are formed by penetrating the first upper insulating layer 107, a protective layer 161 may be formed on the first upper insulating layer 107. The protective layer 161 may be formed of a material having an adhesion to a conductive adhesive material 111 formed in a subsequent process, which is weaker than that of the first upper insulating layer 107. For example, the protective layer 161 may include a photoresist layer or a carbon layer.

Subsequently, the grooves 109, penetrating the protective layer 161 and the first upper insulating layer 107, may be formed through a photolithography process and an etching process. The grooves 109 may expose the first conductive contact patterns 105. The protective layer 161 may serve as an etch barrier during the etching process of the first upper insulating layer 107.

Subsequently, each of the grooves 109 is filled with the conductive adhesive material 111. The conductive adhesive material 111 is the same as the conductive adhesive material 111A described with reference to FIG. 1A. The conductive adhesive material 111 does not remain around the protective layer 161 having a relatively weak adhesion, but may be filled in the grooves 109. The conductive adhesive material 111 may be formed through a spin coating process, but the present disclosure is not limited thereto.

Referring to FIG. 3B, a portion of the conductive adhesive material 111, shown in FIG. 3A, is removed such that an upper portion of each of the grooves 109 is exposed. Accordingly, the conductive adhesive material 111A is formed in each of the grooves 109 with a target height. The removal height of the conductive adhesive material 111 may be controlled by adjusting a rinsing time.

Referring to FIG. 3C, before the second structure B is disposed on the first structure A as described with reference to FIG. 1A, the protective layer 161 may be removed. Accordingly, an upper surface of the first upper insulating layer 107 is exposed.

Figure 4:
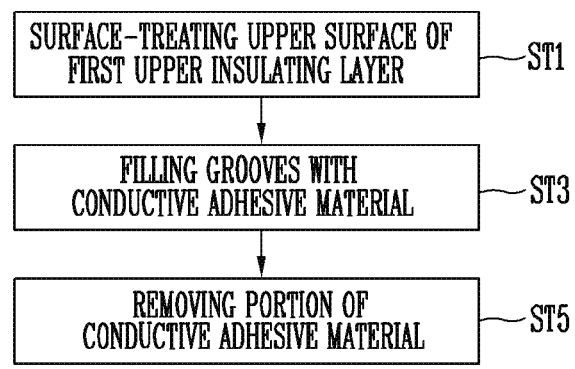
FIG. 4 is a flowchart illustrating an embodiment of the process of forming the conductive adhesive material in the grooves of the first upper insulating layer shown in FIG. 1A.

FIG. 4 is a flowchart illustrating an embodiment of the process of forming the conductive adhesive material 111A in the grooves 109 of the first upper insulating layer 107 shown in FIG. 1A.

Referring to FIG. 4, before grooves are formed by penetrating a first upper insulating layer and then filled with a conductive adhesive material, an upper surface of the first upper insulating layer may be surface-treated in process ST1. The surface treatment process of the first upper insulating layer may be changed depending on the solvent property of the conductive adhesive material. In an embodiment, when the conductive adhesive material has hydrophilicity, the surface of the first upper insulating layer may be hydrophobic-treated. In another embodiment, when the conductive adhesive material has hydrophobicity, the surface of the first upper insulating layer may be hydrophilic-treated.

Subsequently, in process ST3, the conductive adhesive material may be formed, filling the grooves within the first upper insulating layer. The conductive adhesive material is the same as the conductive adhesive material 111A described with reference to FIG. 1A. As explained previously with regard to FIG. 3A, the conductive adhesive material has a weak adhesion to the upper surface of the surface-treated first upper insulating layer. This means that the conductive adhesive material does not remain on the upper surface of the first upper insulating layer, but may fill the grooves.

Subsequently, in process ST5, a portion of the conductive adhesive material is removed so that a portion of each of the grooves is exposed. Accordingly, the conductive adhesive material 111A having a target height is formed in each of the grooves 109, as shown in FIG. 1A.

Hereinafter, various embodiments of the first lower structure 103 and the second lower structure 123, which are described with reference to FIG. 1A, will be described.

Figure 5:
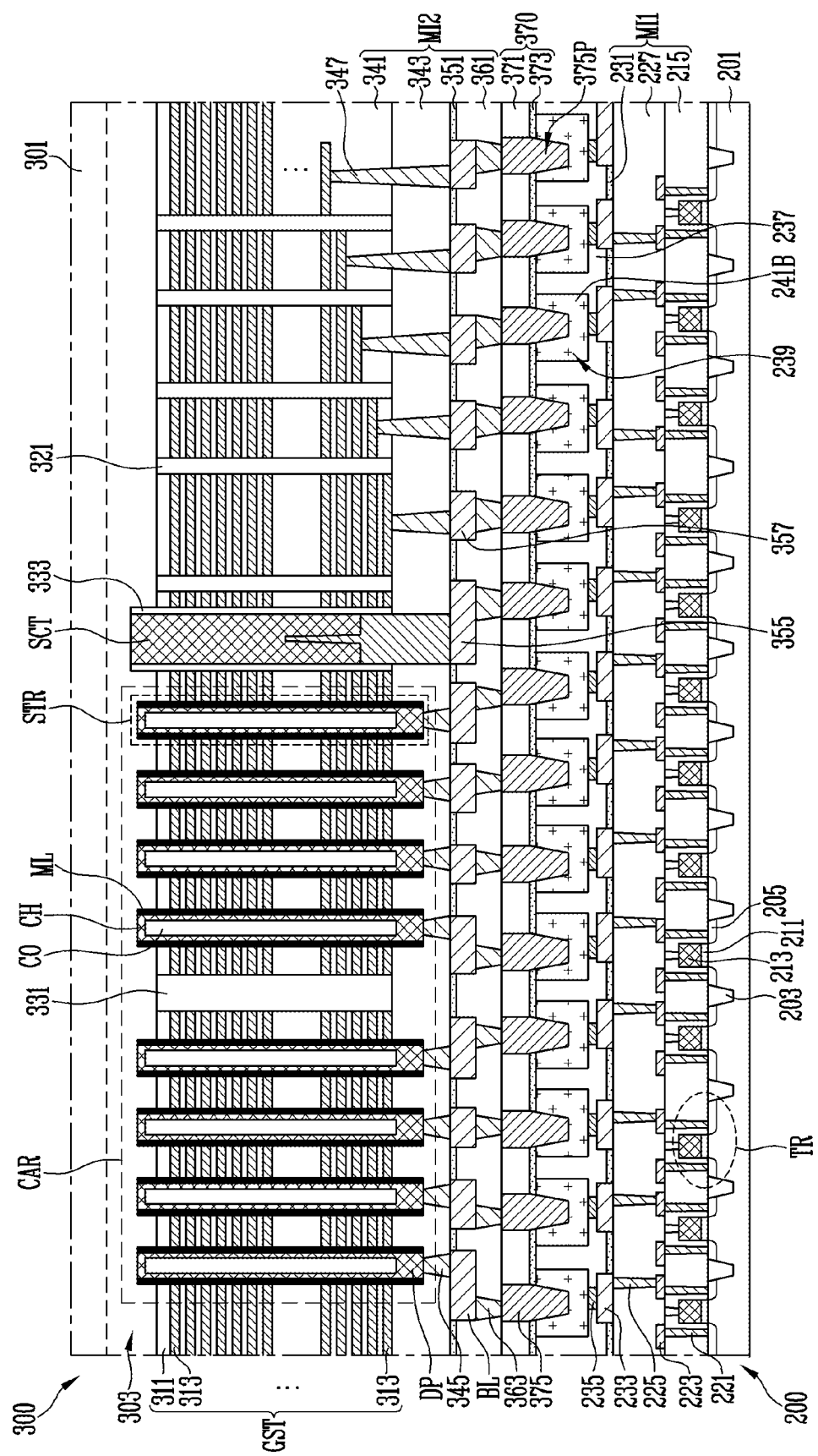
FIG. 5 is a sectional view illustrating a semiconductor memory device in accordance with an embodiment of the present disclosure.

FIG. 5 is a sectional view illustrating a semiconductor memory device in accordance with an embodiment of the present disclosure. FIG. 5 illustrates a semiconductor memory device in an embodiment of the present disclosure, in which a first lower structure 200 includes transistors, constituting a peripheral circuit, and a second lower structure 300 includes a memory cell array.

Referring to FIG. 5, the first lower structure 200, formed on a first substrate 201, may include transistors TR, constituting a peripheral circuit, a first multi-layered insulating layer MI1 covering the transistors TR, and connection structures 221, 223, and 225, penetrating the first multi-layered insulating layer MI1.

The transistors TR may be separated from each other by isolation layers 203 disposed in the first substrate 201. Each of the transistors TR may include a gate insulating layer 211 formed on an active region, divided by the isolation layers 203, a gate electrode 213 formed on the gate insulating layer 211, and impurity regions 205 formed in the first substrate 210 at both sides of the gate electrode 213. Each of the impurity regions 205 is a region including an n-type or p-type dopant, and may be used as a source region or drain region. The transistors TR may be connected to a memory cell array CAR, and control an operation of the memory cell array CAR.

The first multi-layered insulating layer MI1 may include two or more insulating layers 215 and 227. In some cases, the first multi-layered insulating layer MI1 may include at least one first etch stop layer 231. For example, the first multi-layered insulating layer MI1 may include a first oxide layer 215, formed on the first substrate 201 to cover the transistors TR, a second oxide layer 227, formed on the first oxide layer 215, and the first etch stop layer 231, formed on the second oxide layer 227. The stacking structure of the first multi-layered insulating layer MI1 is not limited to the example shown in FIG. 5, and may be modified in various ways. For example, the first etch stop layer 231 may be formed of a material having an etch rate different from that of the oxide layer. In other words, the first etch stop layer 231 may include a nitride layer.

The connection structures 221, 223, and 225 may include contact plugs 221 and 225 penetrating the first multi-layered insulating layer MI1 and conductive pads 223. For example, the connection structures 221, 223, and 225 may include first contact plugs 221, first conductive pads 223, formed to have a width wider than that of the first contact plugs 221, and second contact plugs 225, connected to the first conductive pads 223. The first contact plugs 221 may penetrate the first oxide layer 215 and may be connected to the impurity regions 205 and the gate electrode 213 of the transistors TR. The first conductive pads 223 may be connected to some of the first contact plugs 221 in the second oxide layer 227. The second contact plugs 225 may penetrate the second oxide layer 227 and be connected to some of the first conductive pads 223. The connection structures 221, 223, and 225 are not limited to the example shown in FIG. 5, and may be modified in various ways. For example, the connection structures 221, 223, and 225 may be formed of various conductive materials.

First conductive contact patterns 233 and 235 and a first upper insulating layer 237 are disposed on the first substrate 201 with the first lower structure 200 interposed therebetween.

The first conductive contact patterns 233 and 235 may be electrically connected to the connection structures 221, 223, and 225. For example, the first conductive contact patterns 233 and 235 may penetrate the first etch stop layer 231 and be connected to the second contact plugs 225.

Each of the first conductive contact patterns 233 and 235 may include at least one of a lower conductive pattern 233 and an upper conductive pattern 235. The lower conductive pattern 233 may penetrate the first etch stop layer 231 to be connected to the corresponding second contact plugs 225. The lower conductive pattern 233 may be formed to have a wider width than that of the corresponding second contact plug 225. The upper conductive pattern 235 may be disposed on the lower conductive pattern 233. The upper conductive pattern 235 may be formed to have a width narrower than that of the lower conductive pattern 233. The upper conductive pattern 235 may be omitted in some cases.

The first conductive contact patterns 233 and 235 may be formed of the same material as the first conductive contact patterns, described with reference to FIG. 1A. The first conductive contact patterns 233 and 235 may be connected to the transistors TR via the connection structures 221, 223, and 225. For example, each of the first conductive contact patterns 233 and 235 may be connected to one corresponding thereto among the transistors TR via at least one connection structure. In an embodiment, a first conductive contact pattern and a transistor, which correspond to each other, may be electrically connected to each other via at least one contact plug and at least one conductive pad. In the example shown in FIG. 5, one of the first contact plugs 221, one of the first conductive pads 223, and one of the second contact plugs 225 may be used such that a pair of first conductive contact pattern and transistor, which correspond to each other, are electrically connected to each other. The embodiment of the present disclosure is not limited thereto, and the arrangement and number of connection structures penetrating the first multi-layered insulating layer MI1 may be modified in various ways such that a pair of first conductive contact pattern and transistor, which correspond to each other, are electrically connected to each other.

The first upper insulating layer 237 may include grooves 239, overlapping with the first conductive contact patterns 233 and 235. The grooves 239 expose the first conductive contact patterns 233 and 235, respectively. The first upper insulating layer 237 may be formed of an oxide layer. The first upper insulating layer 237 may be formed over the transistors TR with the first multi-layered insulating layer MI1 interposed therebetween.

The second lower structure 300, formed on a second substrate 301, may include the memory cell array CAR, a second multi-layered insulating layer MI2, bit lines BL, connection structures 345, 347, 363, 355, and 357, a plurality of supports 321, a source contact structure SCT, and a slit insulating layer 331. The memory cell array CAR includes a plurality of memory strings STR. The second multi-layered insulating layer MI2 overlaps with the memory cell array CAR. Furthermore, the bit lines BL may be buried in the second multi-layered insulating layer MI2.

Second conductive contact patterns 375 and a second upper insulating layer 370 may be disposed on the second substrate 301 with the second lower structure 300 interposed therebetween.

The memory cell array CAR may include memory strings STR connected between a source region 303 and the bit lines BL. The source region 303 may be formed in the second substrate 301, and may include an impurity. The impurity of the source region 303 may include an n-type dopant.

The memory strings STR may be disposed between the second substrate 301 and the second upper insulating layer 370. Gate electrodes of the memory strings STR may be connected to conductive patterns 313 of a gate stack structure GST.

The gate stack structure GST may include interlayer insulating layers 311 and the conductive patterns 313, which are alternately stacked between the second substrate 301 and the second multi-layered insulating layer MI2. The gate stack structure GST is penetrated by channel structures CH.

The channel structures CH are used as channel regions of the memory strings STR. The channel structures CH may be formed of a semiconductor layer. A central region of each of the channel structures CH may be filled with a core insulating layer CO. One end of each of the channel structures CH may be connected to the source region 303. The other end of each of the channel structures CH may be connected to a doped pattern DP overlapping with the core insulating layer CO. The doped pattern DP may include an impurity. For example, the doped pattern DP may include an n-type dopant. The doped pattern DP may be used as a drain region.

A memory layer ML may be disposed between each of the conductive patterns 313 and each of the channel structures CH, and to store data. The memory layer ML may include a tunnel insulating layer, a data storage layer, and a blocking insulating layer, which are vertically stacked toward a sidewall of the gate stack structure GST from a sidewall of each of the channel structures CH. The tunnel insulating layer may include a silicon oxide layer through which charges can tunnel. The data storage layer may be formed of a charge trapping layer, formed of a material layer including conductive nano dots, or formed of a phase change material layer. For example, the data storage layer may be formed of a silicon nitride layer in which charges can be trapped. The blocking insulating layer may include an oxide capable of blocking charges.

A source select transistor, memory cells, and a drain select transistor, which constitute each of the memory strings STR, may be defined at intersection portions of the conductive patterns 313 and the channel structures CH. A gate electrode of the source select transistor is connected to a source-side conductive pattern adjacent to the source region 303, among the conductive patterns 313, and a gate electrode of the drain select transistor is connected to a bit line-side conductive pattern adjacent to each of the bit lines BL among the conductive patterns 313. Gate electrodes of the memory cells are connected to intermediate conductive patterns, among the conductive patterns 313. The intermediate conductive patterns are conductive patterns disposed between the source-side conductive pattern and the bit line-side conductive pattern.

The gate stack structure GST may be separated into a plurality of memory blocks by the slit insulating layer 331 penetrating the gate stack structure GST. The source contact structure SCT may penetrate the gate stack structure GST and transmit an electrical signal to the source region 303. The source contact structure SCT may be formed with a single conductive layer or be formed with two or more conductive layers. The source contact structure SCT and the gate stack structure GST may be insulated from each other by a sidewall insulating layer 333 disposed therebetween.

The conductive patterns 313 of the gate stack structure GST may include a contact region formed in a step structure. The contact region formed in the step structure may be penetrated by the plurality of supports 321.

The second multi-layered insulating layer MI2 may be disposed between the memory cell array CAR and the second upper insulating layer 370, and include two or more insulating layers 341, 343, and 361. In some cases, the second multi-layered insulating layer MI2 may include at least one second etch stop layer 351. For example, the second multi-layered insulating layer MI2 may include a third oxide layer 341, a fourth oxide layer 343, the second etch stop layer 351, and a fifth oxide layer 361. The third oxide layer 341 may be disposed on one surface of the second substrate 301 to cover the step structure of the gate stack structure GST. The fourth oxide layer 343, the second etch stop layer 351, and the fifth oxide layer 361 may be sequentially disposed between the second upper insulating layer 370 and the third oxide layer 341. The stacking structure of the second multi-layered insulating layer MI2 is not limited to the example shown in FIG. 5, and may be modified in various ways. For example, the second etch stop layer 351 may be formed of a material having an etch rate different from the oxide layer. In other words, the second etch stop layer 351 may include a nitride layer.

The source contact structure SCT may extend to penetrate the fourth oxide layer 343.

The bit lines BL may be buried in the second etch stop layer 351 and the fifth oxide layer 361.

The connection structures 345, 347, 363, 355, and 357 may include contact plugs 345, 347, and 363 and conductive pads 355 and 357, which penetrate the second multi-layered insulating layer MI2. For example, the connection structures 345, 347, 363, 355, and 357 may include drain contact plugs 345, gate contact plugs 347, a source pad 355, gate pads 357, and upper contact plugs 363. The source pad 355 may be formed to have a width wider than that of the source contact structure SCT, and the gate pads 357 may be formed to have a width wider than that of the gate contact plugs 347. The drain contact plugs 345 may penetrate the fourth oxide layer 343 and connect the channel structures CH to the bit lines BL. The gate contact plugs 347 may be in contact with the conductive patterns 313 and extend to penetrate the third oxide layer 341 and the fourth oxide layer 343. The source pad 355 may be in contact with the source contact structure SCT and extend to penetrate the second etching stop layer 351 and a portion of the fifth oxide layer 361. The upper contact plugs 363 may be in contact with the bit lines BL, the source pad 355, and the gate pads 357, and extend to penetrate the fifth oxide layer 361. The connection structures 345, 347, 363, 355, and 357 are not limited to the example shown in FIG. 5, and may be modified in various ways. For example, the connection structures 345, 347, 363, 355, and 357 may be formed of various conductive materials.

The second upper insulating layer 370 is disposed between the second multi-layered insulating layer MI2 and the first substrate 201, and may be formed on the first upper insulating layer 237. The second upper insulating layer 370 is in direct contact with the first upper insulating layer 237. The second upper insulating layer 370 may be formed in a stacked structure, composed of the oxide layer 371 and an etch stop layer 373. The stacked structure of the second upper insulating layer 370 is not limited thereto, and may be modified in various ways. For example, the second upper insulating layer 370 may be formed in a single-layered structure of the oxide layer.

The second conductive contact patterns 375 are in contact with the upper contact plugs 363, and extend to penetrate the second upper insulating layer 370. The second conductive contact patterns 375 have protrusion parts 375P protruding to the cavernous region of the grooves 239. The second conductive contact patterns 375 may be formed of the same material as the second conductive contact patterns described with reference to FIG. 1A. The second conductive contact patterns 375 may be connected to the memory cell array CAR via the connection structures 345, 347, 363, 355, and 357. For example, each of the conductive patterns 313, the bit lines BL, and the source contact structure SCT may be connected to the corresponding second conductive contact pattern 375 via at least one connection structure. In accordance with the embodiment shown in FIG. 5, a pair of bit line BL and second conductive contact pattern 375, which correspond to each other, may be electrically connected via one of the upper contact plugs 363. Furthermore, a pair of conductive pattern 313 and second conductive contact pattern 375, which correspond to each other, may be electrically connected via one of the gate contact plugs 347, one of the gate pads 357, and one of the upper contact plugs 363. The embodiment of the present disclosure is not limited thereto, and the arrangement and number of connection structures penetrating the second multi-layered insulating layer MI2 may be modified in various ways so as to connect each of the second conductive contact patterns 375 to one corresponding thereto among the conductive patterns 313, the bit lines BL, and the source contact structure SCT.

The arrangements, widths, and heights of the protrusion parts 375P of the second conductive contact patterns 375 and the grooves 239 of the first upper insulating layer 237 may be the same as described with reference to FIG. 1A. Accordingly, the second conductive contact patterns 357 can be spaced apart from the first conductive contact patterns 235. Alternatively, the arrangements, widths, and heights of the protrusion parts 375P of the second conductive contact patterns 375 and the grooves 239 of the first upper insulating layer 237 may be the same as described with reference to FIG. 2B or 2C. The second contact patterns 375 may be electrically connected to the first conductive contact patterns 235 by filling the respective grooves 239 with the conductive adhesive patterns 241B. The conductive adhesive patterns 241B may extend between the second conductive contact patterns 375 and the first conductive contact patterns 235. The conductive adhesive patterns 241B may include a cured material of epoxy resin or include a cured material of a compound having silver nano particles, boron nitride, and epoxy. In another embodiment, there may be a space between each of the conductive adhesive patterns 241B and the second upper insulating layer 370, creating a gap G interposed therebetween as described with reference to FIG. 2A.

FIGS. 6A to 6C, 7A to 7C, and 8 are sectional views illustrating an embodiment of a method of manufacturing the semiconductor memory device shown in FIG. 5. In the following drawings, a structure of a first lower structure and a second lower structure is the same as described with reference to FIG. 5, and therefore, overlapping descriptions will be omitted.

Figure 6A:
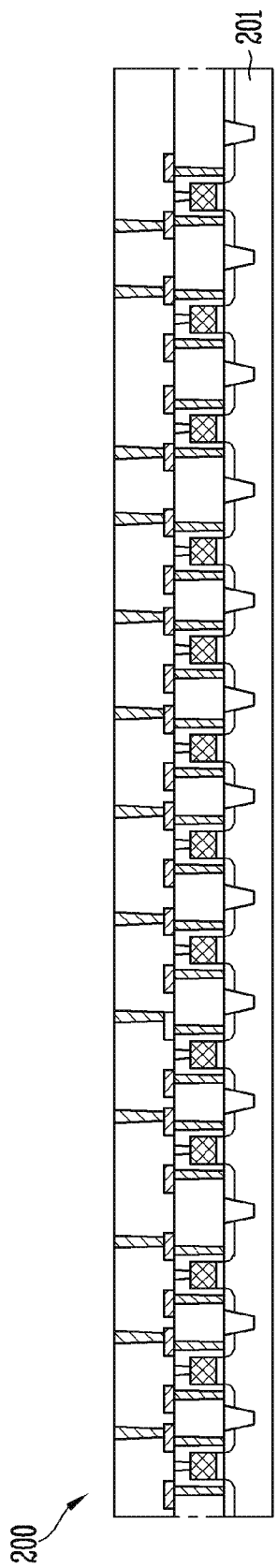
FIGS. 6A to 6C, 7A to 7C, and 8 are sectional views illustrating an embodiment of a method of manufacturing the semiconductor memory device shown in FIG. 5.
Figure 6B:
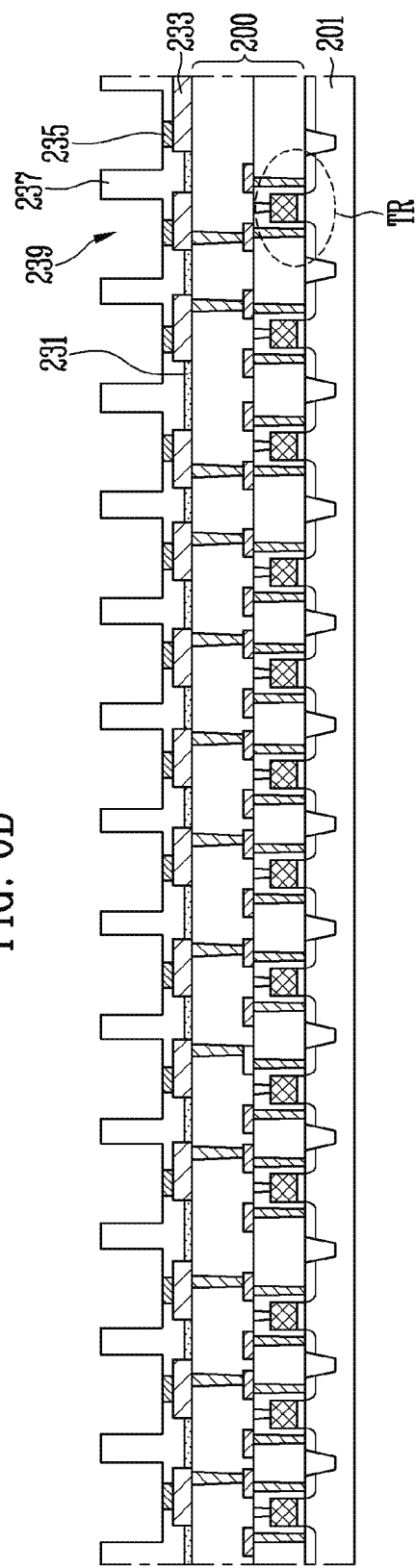
Figure 6C:
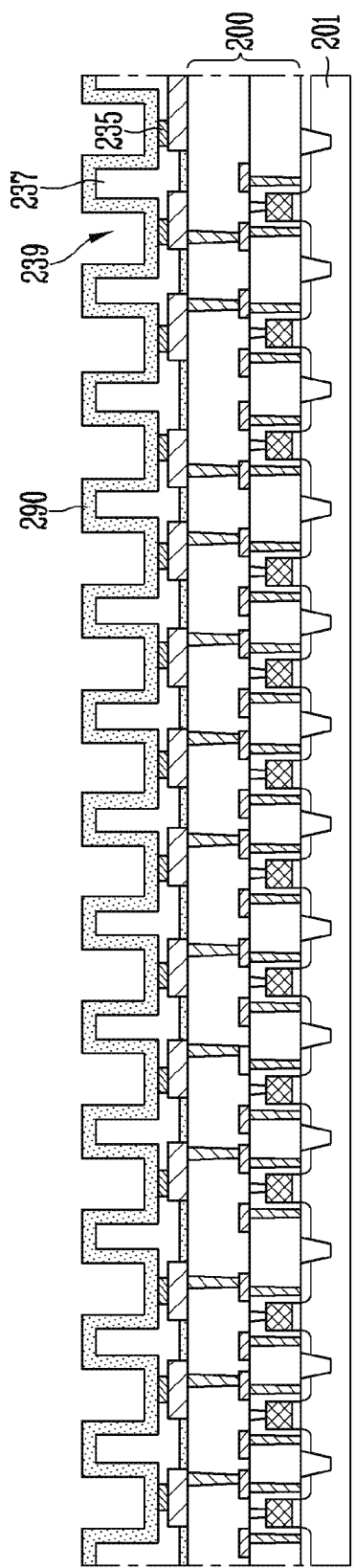

FIGS. 6A to 6C are sectional views illustrating a process of forming a first structure on a first substrate.

Referring to FIG. 6A, a first lower structure 200 described with reference to FIG. 5 is formed on a first substrate 201.

Referring to FIG. 6B, first conductive contact patterns 233 and 235 are formed on the first lower structure 200. The first conductive contact patterns 233 and 235 are connected to transistors TR of the first lower structure 200 as described with reference to FIG. 5.

Subsequently, a first upper insulating layer 237, covering the first conductive contact patterns 233 and 235, may be formed on the first lower structure 200. Subsequently, grooves 239 may be formed using a photolithography process and an etching process, thereby exposing the corresponding first conductive contact patterns 233 and 235. For example, upper patterns 235 of the first conductive contact patterns may be exposed through the grooves 239. When the upper patterns 235 are omitted, lower patterns 233 of the first conductive contact patterns may be exposed through the grooves 239.

In the process of forming the grooves 239 in the first upper insulating layer 237, the protective layer 161 may be formed as described with reference to FIG. 3A. Alternatively, an upper surface of the first upper insulating layer 237 may be surface-treated in the process ST1 described with reference to FIG. 4.

Referring to FIG. 6C, an anti-oxidation layer 290 may be formed so as to protect exposed surfaces of the first conductive contact patterns. For example, the anti-oxidation layer 290 may be conformally formed on a surface of the first upper insulating layer 237 to cover exposed surfaces of the upper patterns 235. The anti-oxidation layer 290 may be formed of a material having an etch rate different from that of the first upper insulating layer 237 so as to reduce damage of the first upper insulating layer 237 and to be selectively removed. For example, the anti-oxidation layer 290 may include a nitride.

Figure 7A:
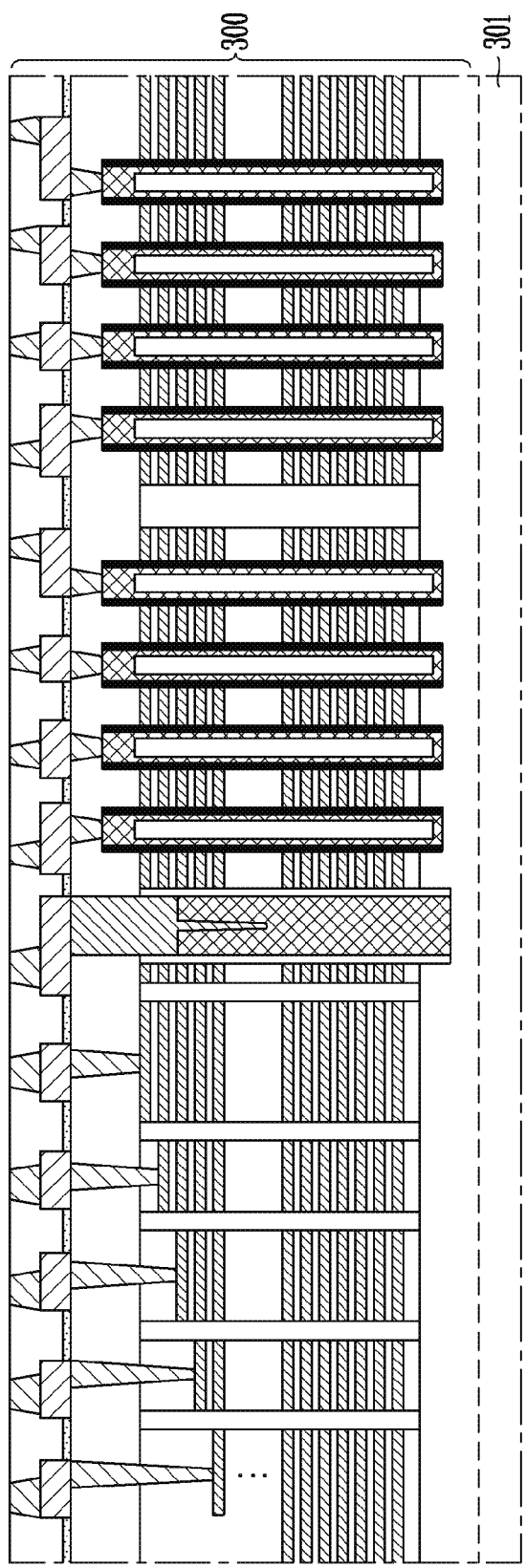
Figure 7B:
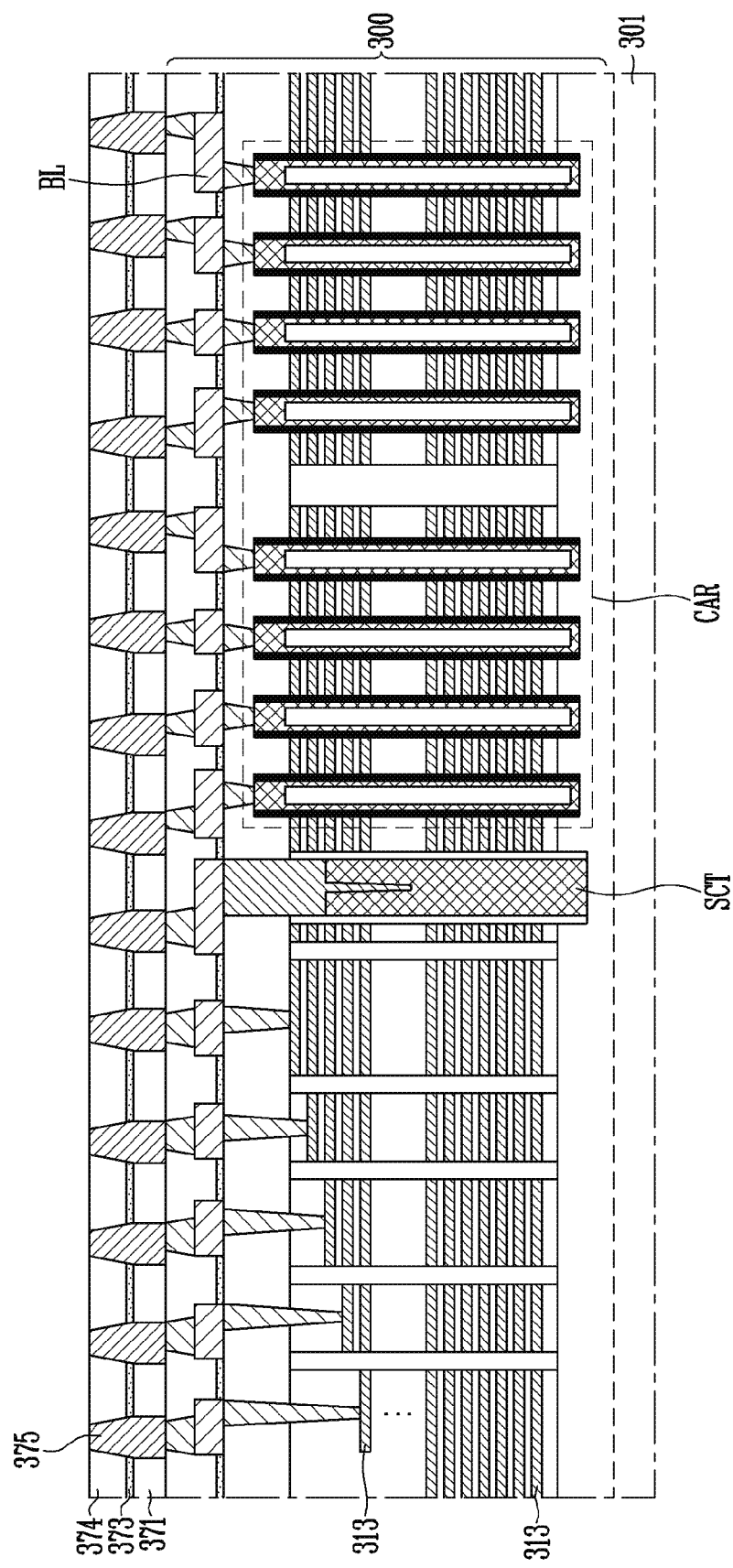
Figure 7C:
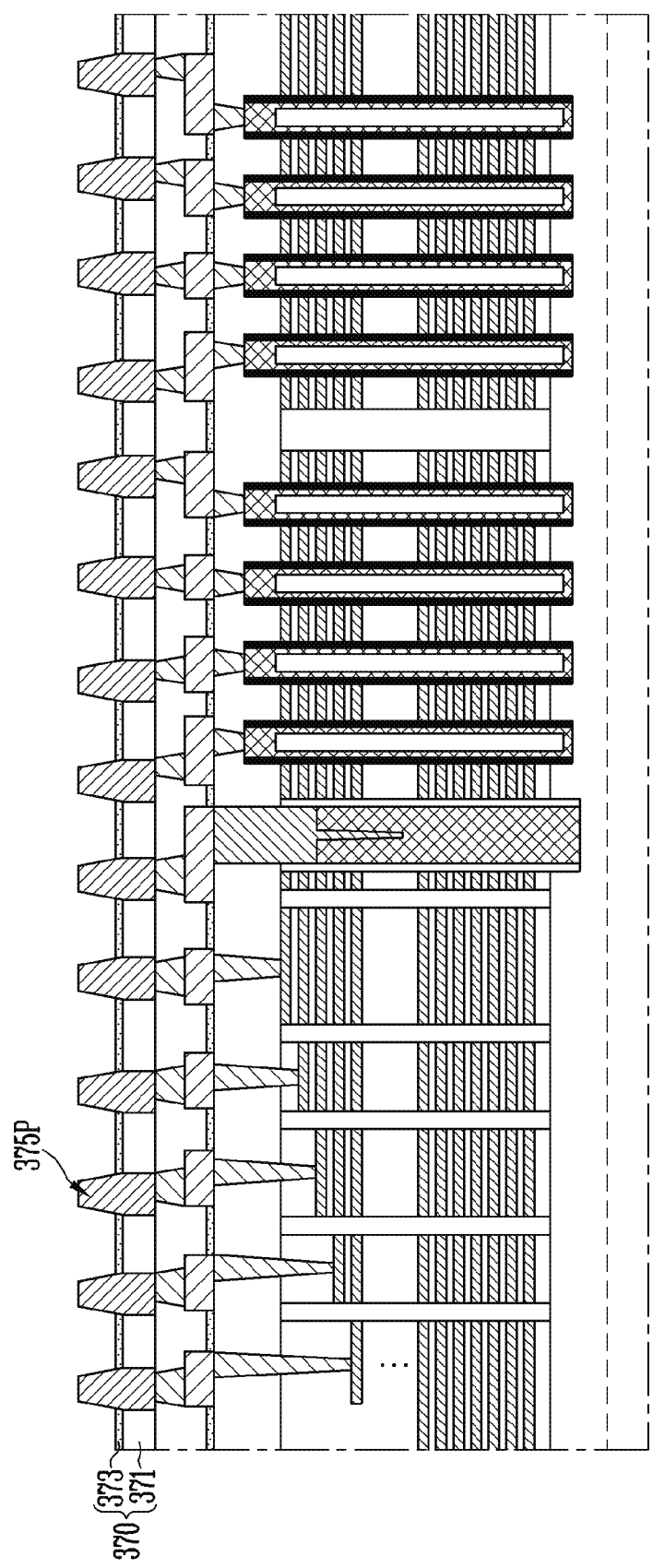

FIGS. 7A to 7C are sectional views illustrating a process of forming a second structure on a second substrate.

Referring to FIG. 7A, a second lower structure 300 described with reference to FIG. 5 is formed on a second substrate 301.

Referring to FIG. 7B, at least one oxidation layer may be formed on the second lower structure 300. In an embodiment, a structure, in which an oxide layer 371, an etch stop layer 373, and an oxide layer 374 are stacked, may be formed on the second lower structure 300. The etch stop layer 373 may include a nitride layer.

Subsequently, second conductive contact patterns 375 may be formed, penetrating the structure in which the oxide layer 371, the etch stop layer 373, and the oxide layer 374 are stacked. The second conductive contact patterns 375 may be connected to a memory cell array CAR of the second lower structure 300 as described with reference to FIG. 5. For example, the second conductive contact patterns 375 may be electrically connected to the memory cell array CAR via bit lines BL, a source contact structure SCT, and conductive patterns 313 of the second lower structure 300.

Referring to FIG. 7C, the oxide layer 374, shown in FIG. 7B, is removed, exposing the etch stop layer 373. Accordingly, a second upper insulating layer 370 may be formed, which includes the oxide layer 371 and the etch stop layer 373. In addition, protrusion parts 375P of the second conductive contact patterns 375 may be exposed, which protrudes from the second upper insulating layer 370.

Figure 8:
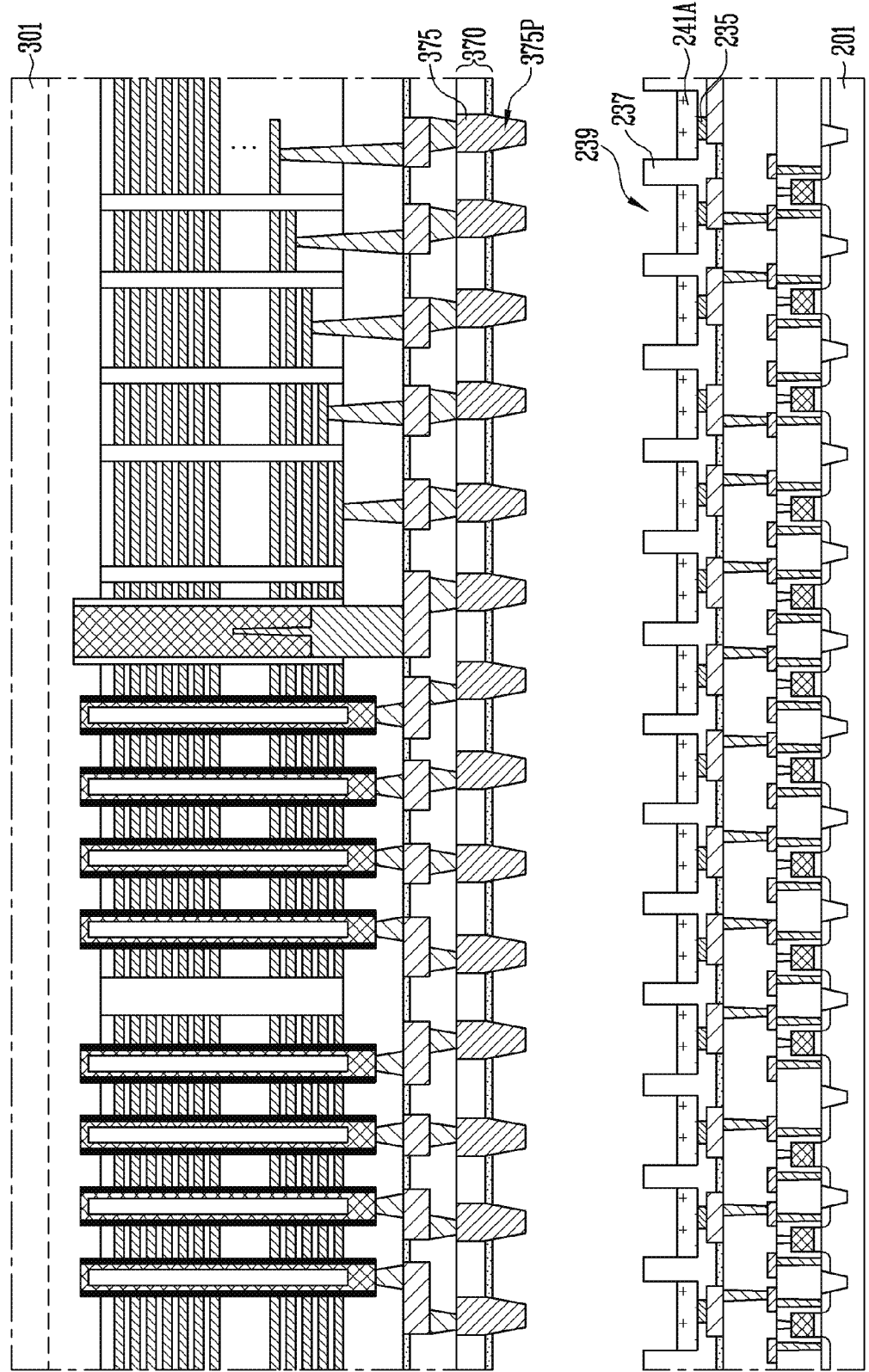

FIG. 8 is a sectional view illustrating a process of disposing the second structure on the first structure.

Referring to FIG. 8, before the second structure is disposed on the first structure, the first conductive contact patterns are exposed by removing the anti-oxidation layer 290 described with reference to FIG. 6C. For example, the anti-oxidation layer 290 is removed, so that the upper patterns 235 of the first contact patterns may be exposed. Subsequently, a conductive adhesive material 241A may be formed in each of the grooves 239. The conductive adhesive material 241A may be formed using the methods described with reference to FIGS. 3A to 3C, or be formed using the methods described with reference to FIG. 4.

Subsequently, the second substrate 301 is disposed on the first substrate 201 such that the second upper insulating layer 370 is formed on the first upper insulating layer 237. The second substrate 301 is aligned on the first substrate 201 such that the protrusion parts 375P of the second conductive contact patterns 375 overlap with their corresponding grooves 239.

Subsequently, as described with reference to FIG. 1B, the first upper insulating layer 237 and the second upper insulating layer 370 are adhered closely to each other such that the protrusion parts 375P of the second conductive contact patterns 375 are aligned in the grooves 239. Then, the conductive adhesive material 241A is cured. Accordingly, the upper patterns 235 of the first conductive contact patterns can be electrically connected to the second conductive contact patterns 375 with the conductive adhesive patterns 241B as described with reference to FIG. 5.

Figure 9:
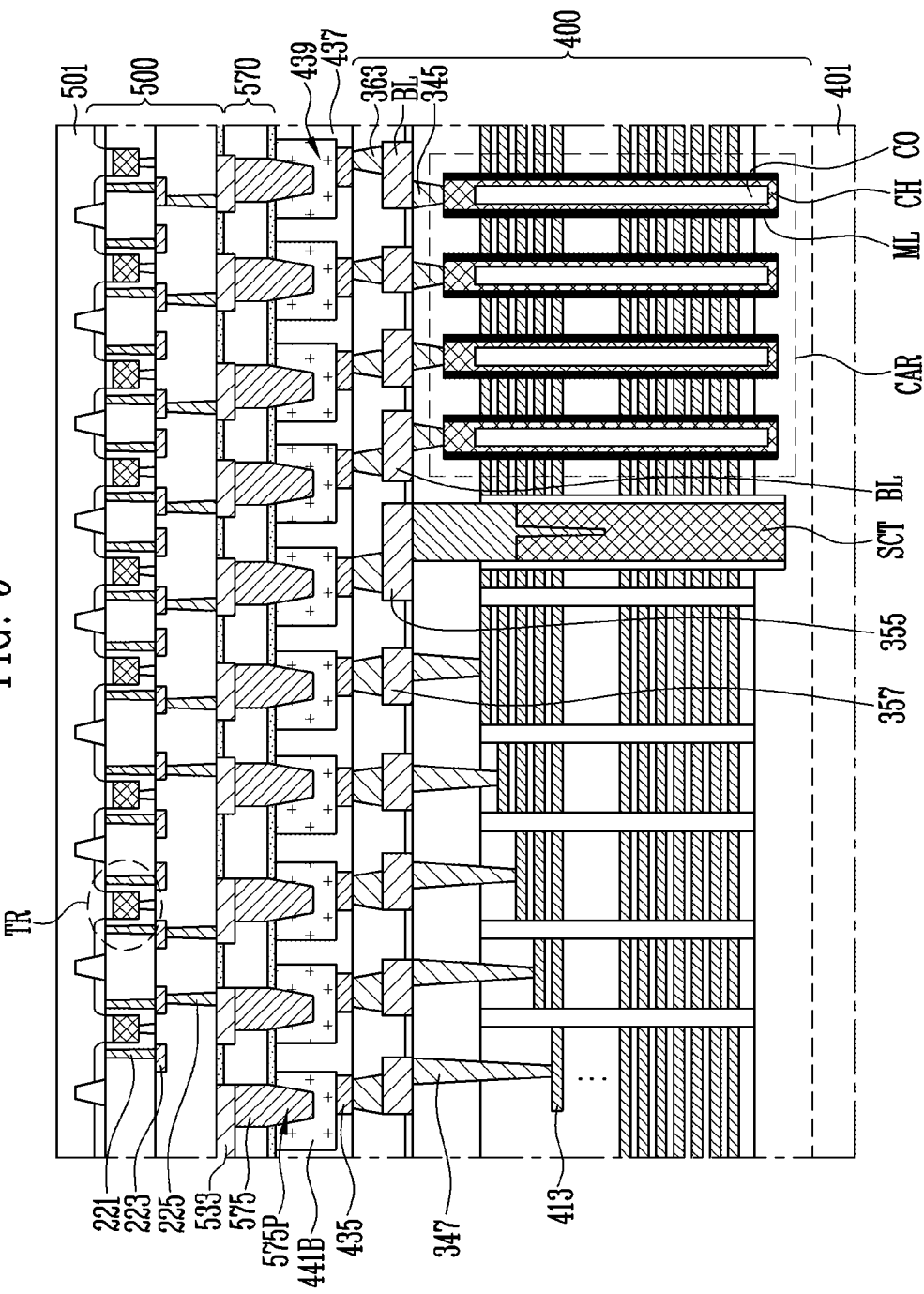
FIG. 9 is a sectional view illustrating a semiconductor memory device in accordance with an embodiment of the present disclosure.

FIG. 9 is a sectional view, illustrating a semiconductor memory device in accordance with an embodiment of the present disclosure. FIG. 9 illustrates a semiconductor memory device, in accordance with an embodiment of the present disclosure, in which a first lower structure 400 include a memory cell array and a second lower structure 500, the second lower structure 500 including transistors constituting a peripheral circuit.

Referring to FIG. 9, the first lower structure 400, formed on a first substrate 401, is formed in the same structure as the second lower structure 300, as described with reference to FIG. 5. In other words, a memory cell array CAR may be formed on the first substrate 401. The memory cell array CAR includes the memory layers ML and the channel structures CH having the core insulating layers CO. First conductive contact patterns 435 and a first upper insulating layer 437 are disposed on the first substrate 401 with the first lower structure 400 interposed therebetween.

The first conductive contact patterns 435 may be connected to the memory cell array CAR of the first lower structure CAR through connection structures 345, 347, 363, 355, and 357. For example, the first conductive contact patterns 435 may be connected to the memory cell array CAR via bit lines BL, a source contact structure SCT, and conductive patterns 413 of the first lower structure 400 through connection structures identical to the connection structures 345, 347, 363, 355, and 357 shown in FIG. 5.

The first upper insulating layer 437 may be formed of the same material in the same structure as the first upper insulating layer 237 described with reference to FIG. 5. In other words, the first upper insulating layer 437 may include grooves 439 overlapping with the first conductive contact patterns 435.

The second lower structure 500 formed on a second substrate 501 is formed in the same structure as the first lower structure 200 described with reference to FIG. 5. In other words, transistors TR, constituting a peripheral circuit, may be formed on the second substrate 501. Second conductive contact patterns 575 and a second upper insulating layer 570 may be formed on the second substrate 501 with the second lower structure 500 interposed therebetween.

The second conductive contact patterns 575 may be connected to the transistors TR of the second lower structure 500 through lower patterns 533 and connection structures 221, 223, and 225. The second conductive contact patterns 575 may be formed of the same material in the same structure as the second conductive contact patterns 375 shown in FIG. 5. In other words, the second conductive contact patterns 575 may include protrusion parts 575P protruding from the second upper insulating layer 570. The second conductive contact patterns 575 may be formed on the lower patterns 533. The lower patterns 533 may be formed in the same structure as the lower patterns 233 described with reference to FIG. 5.

The second upper insulating layer 570 may be formed of the same material in the same structure as the second upper insulating layer 370 described with reference to FIG. 5.

The first conductive contact patterns 435 and the second conductive contact patterns 575 may be electrically connected by conductive adhesive patterns 441B, filling the grooves 439. The conductive adhesive patterns 441B may be formed of the same material as the conductive adhesive patterns 241B described with reference to FIG. 5.

The semiconductor memory device described with reference to FIG. 9 may be formed using the method of manufacturing the semiconductor memory device described with reference to FIGS. 6A to 6C, 7A to 7C, and 8.

Figure 10:
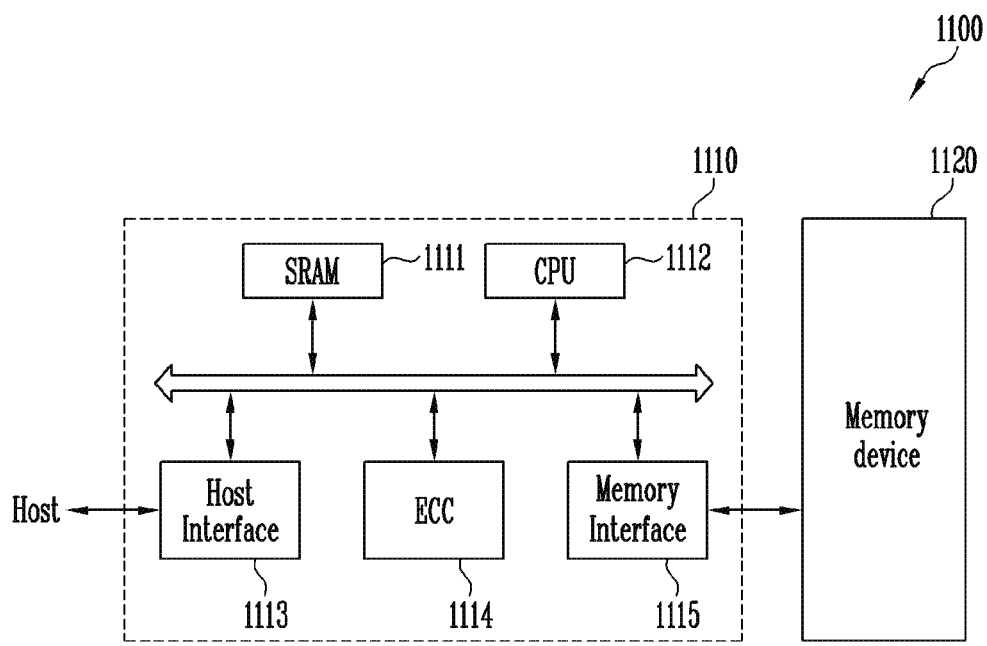
FIG. 10 is a block diagram illustrating a configuration of a memory system in accordance with an embodiment of the present disclosure.

FIG. 10 is a block diagram illustrating a configuration of a memory system in accordance with an embodiment of the present disclosure.

Referring to FIG. 10, the memory system 1100 in accordance with the embodiment of the present disclosure includes a memory device 1120 and a memory controller 1110.

The memory device 1120 may be a multi-chip package configured with a plurality of flash memory chips. The memory device 1120 may include any one of the semiconductor memory devices shown in FIGS. 5 and 9.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 11:
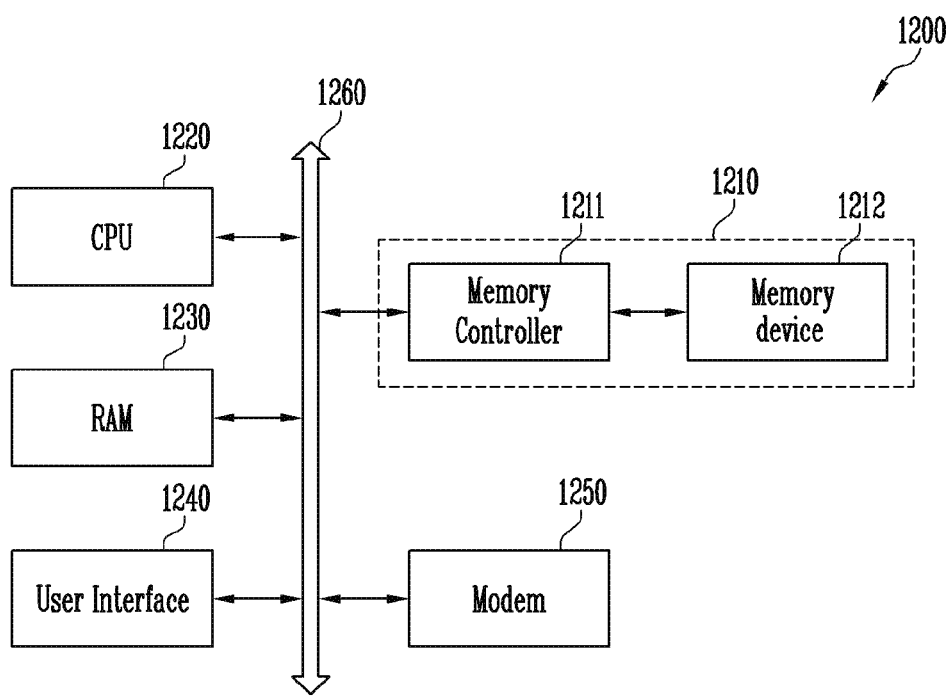
FIG. 11 is a block diagram illustrating a configuration of a computing system in accordance with an embodiment of the present disclosure.

FIG. 11 is a block diagram illustrating a configuration of a computing system in accordance with an embodiment of the present disclosure.

Referring to FIG. 11, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

In accordance with the present disclosure, a first conductive contact pattern and a second conductive contact pattern are connected to each other by using a groove of an insulating layer and a conductive adhesive material filling the groove, so that the memory cell array and the peripheral circuit can be connected to each other.

The groove provides a space into which a protrusion part of the second conductive contact pattern is inserted, so that the alignment stability of the second conductive contact pattern can be improved.

The conductive adhesive material may have fluidity through viscosity control. Accordingly, although the second conductive contact pattern and the first conductive contact pattern are not in direct contact with each other, the first conductive contact pattern may be stably connected to the second conductive contact pattern disposed in the groove through a cured material of the conductive adhesive material filling the groove.

As described above, in the present disclosure, the stability of a manufacturing process of the semiconductor memory device may be improved by using the groove of the insulating layer and the conductive adhesive material.

The embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A semiconductor memory device comprising:
    a first substrate including a peripheral circuit, first conductive contact patterns connected to the peripheral circuit, and a first upper insulating layer having grooves exposing the first conductive contact patterns;
    a second substrate including a memory cell array, a second upper insulating layer disposed on the memory cell array, the second upper insulating layer formed between the memory cell array and the first upper insulating layer, second conductive contact patterns protruding through the second upper insulating layer into an opening of the grooves; and
    conductive adhesive patterns filling the grooves to connect the second conductive contact patterns to the first conductive contact patterns,
    wherein the conductive adhesive patterns surround the second conductive contact patterns to contact the second conductive contact patterns and the first conductive contact patterns.

2. The semiconductor memory device of claim 1, wherein the conductive adhesive patterns completely fill the grooves.

3. The semiconductor memory device of claim 1, wherein the conductive adhesive patterns partially fill the grooves, creating a gap.

4. The semiconductor memory device of claim 1, wherein each of the conductive adhesive patterns includes a cured material of epoxy resin.

5. The semiconductor memory device of claim 1, wherein each of the conductive adhesive patterns includes a cured material of a compound having silver nano particles, boron nitride, and epoxy.

6. The semiconductor memory device of claim 1, further comprising:
    a plurality of transistors within the peripheral circuit;
    a multi-layered insulating layer disposed between the first substrate and the first upper insulating layer, the multi-layered insulating layer covering the transistors; and
    a connection structure penetrating the multi-layered insulating layer, the connection structure electrically connecting each of the first conductive contact patterns to a corresponding transistor among the plurality of transistors.

7. The semiconductor memory device of claim 1, wherein the memory cell array includes:
    a gate stack structure disposed between the second substrate and the second upper insulating layer, the gate stack structure including conductive patterns and interlayer insulating layers, which are alternately stacked;
    channel structures penetrating the gate stack structure; and
    a memory layer disposed between each of the conductive patterns and each of the channel structures.

8. The semiconductor memory device of claim 7, further comprising:
    a multi-layered insulating layer disposed between the memory cell array and the second upper insulating layer;
    bit lines buried in the multi-layered insulating layer to be connected to the channel structures; and
    a connection structure penetrating the multi-layered insulating layer, the connection structure electrically connecting each of the second conductive contact patterns to a corresponding pattern of the conductive patterns of the gate structure and a corresponding bit line of the bit lines.

9. The semiconductor memory device of claim 1, wherein a protrusion of the first upper insulating layer from the first conductive contact patterns has a greater height than a height of a protrusion of each of the second conductive contact patterns from the second upper insulating layer.

10. The semiconductor memory device of claim 1, wherein a protrusion of the first upper insulating layer from the first conductive contact patterns has a same height as a height of a protrusion of each of the second conductive contact patterns from the second upper insulating layer.

11. The semiconductor memory device of claim 1, wherein protrusions of the first upper insulating layer from the first conductive contact patterns have a same height as a height of some protrusions of the second conductive contact patterns from the second upper insulating layer and some protrusions of the first upper insulating layer from the first conductive contact patterns have a greater height than a height of the rest of the protrusions of the second conductive contact patterns from the second upper insulating layer.

12. The semiconductor memory device of claim 1, wherein each of the grooves is formed to have a wider width than a corresponding second conductive contact pattern among the second conductive contact patterns.

13. A semiconductor memory device comprising:
    a peripheral circuit and a memory cell array, opposite to each other with a first upper insulating layer interposed therebetween;
    first conductive contact patterns connected to a respective first corresponding portion of the peripheral circuit and the memory cell array, and second conductive contact patterns connected to a respective second corresponding portion of the peripheral circuit and the memory cell array, the first conductive contact patterns opposite to the second conductive contact patterns, the first conductive contact patterns overlapping with grooves, the second conductive contact patterns having protrusion parts protruding to insides of corresponding grooves; and
    conductive adhesive patterns filling the grooves such that the second conductive contact patterns are respectively connected to the first conductive contact patterns,
    wherein the conductive adhesive patterns surround the second conductive contact patterns to contact the second conductive contact patterns and the first conductive contact patterns.

14. The semiconductor memory device of claim 13, wherein the first upper insulating layer farther protrudes to a first height higher than a height of the first conductive contact patterns to define the grooves, wherein the protrusion parts of the second conductive contact patterns are formed to a height equal to or lower than the first height.

15. The semiconductor memory device of claim 13, wherein the conductive adhesive patterns extend between the first conductive contact patterns and the second conductive contact patterns.

16. The semiconductor memory device of claim 13, wherein each of the grooves is formed to have a width wider than a width of a second conductive contact pattern of the second conductive contact patterns.

17. The semiconductor memory device of claim 13, wherein each of the conductive adhesive patterns includes a cured material of epoxy resin or includes a cured material of a compound having silver nano particles, boron nitride, and epoxy.

18. The semiconductor memory device of claim 13, wherein the memory cell array and the peripheral circuit are formed between a first substrate and a second substrate,
wherein the first conductive contact patterns are connected to the memory cell array disposed on the first substrate, and
the second conductive contact patterns are connected to transistors constituting the peripheral circuit disposed on the second substrate.

19. The semiconductor memory device of claim 18, wherein the memory cell array includes:
a gate stack structure including interlayer insulating layers and conductive patterns, which are alternately stacked on the first substrate;
channel structures penetrating the gate stack structure; and
a memory layer disposed between each of the conductive patterns and each of the channel structures.

20. The semiconductor memory device of claim 19, further comprising:
a first multi-layered insulating layer disposed between the memory cell array and the first upper insulating layer;
bit lines buried in the first multi-layered insulating layer to be connected to the channel structures; and
a first connection structure penetrating the first multi-layered insulating layer, the first connection structure electrically connecting each of the first conductive contact patterns to a corresponding bit line of the bit lines and a corresponding conductive pattern of the conductive patterns of the gate stack structure,
wherein the first conductive contact patterns are buried in the first upper insulating layer, face the second conductive contact patterns, and have surfaces opened by the grooves.

21. The semiconductor memory device of claim 19, further comprising:
a second multi-layered insulating layer disposed between the transistors and a second upper insulating layer; and
a second connection structure penetrating the second multi-layered insulating layer, the second connection structure electrically connecting each of the second conductive contact patterns to a corresponding transistor of the transistors.

* * * * *